United States Patent
Rosnell

(10) Patent No.: US 6,870,414 B2
(45) Date of Patent: Mar. 22, 2005

(54) APPLICATION OF A CONTINUOUSLY TUNED PHASE SHIFT TO A PERIODIC SIGNAL

(75) Inventor: Seppo Rosnell, Salo (FI)

(73) Assignee: Nokia Corporation, Espoo (FI)

(*) Notice: Subject to any disclaimer, the term of this patent is extended or adjusted under 35 U.S.C. 154(b) by 66 days.

(21) Appl. No.: 10/383,829

(22) Filed: Mar. 7, 2003

(65) Prior Publication Data

US 2004/0174232 A1 Sep. 9, 2004

(51) Int. Cl.$^7$ ............................................. H03H 11/16
(52) U.S. Cl. ..................................... 327/231; 333/138
(58) Field of Search ............................... 327/371, 261, 327/234, 235, 231, 271; 333/138

(56) References Cited

U.S. PATENT DOCUMENTS 5,939,916 A * 8/1999 Jamal et al. ................ 327/231
6,393,083 B1 * 5/2002 Beukema .................... 375/371

* cited by examiner

*Primary Examiner*—Dinh T. Le
(74) *Attorney, Agent, or Firm*—Alfred A. Fressola; Ware, Fressola, Van Der Sluys & Adolphson

(57) ABSTRACT

The invention relates to a system and a method for applying a continuously tuned phase shift to a periodic signal. In order to avoid distortions in the output phase shifted periodic signal, it is proposed that a phase shifting according to a first control signal and a phase shifting according to a second control signal are applied to the periodic signal in parallel. Both control signals are identical to each other, but shifted in time against each other. Both control signals are varying within a specific range and are jumping between their maximum and minimum value whenever a boarder of this range is reached. The first phase shifted periodic signal and the second phase shifted periodic signal are selected alternately in a way that phase shifts which are based on a portion of a control signal close to its jumping between its maximum and minimum values are excluded.

9 Claims, 6 Drawing Sheets

APPLICATION OF A CONTINUOUSLY TUNED PHASE SHIFT TO A PERIODIC SIGNAL

FIELD OF THE INVENTION

The invention relates to a system for applying a continuously tuned phase shift to a periodic signal, which periodic signal has a periodicity of 2π (radians) and is modulated arbitrarily. The invention also relates to a method of applying a continuously tuned phase shift to such a periodic signal.

BACKGROUND OF THE INVENTION

Systems applying a phase shift to a periodic signal are well known from the state of the art. Such systems may comprise in particular a phase shifter to which the periodic signal and a control signal are supplied. The phase shifter then shifts the phase of the received periodic signal by a value which is determined by the received control signal. The control signal can be a control voltage or a control current, and the applied phase shift is usually linearly dependent on the provided control signal.

For some applications, it is desirable to be able to tune the phase shift applied by a phase shifter to a periodic signal continuously over a very large range. The operating range of a phase shifter, however, is limited by a certain minimum shift and a certain maximum shift. In some cases, also the range of the control signal may be restricted.

The limits of the operating range of a phase shifter and of control signals can be circumvented by making use of the periodicity of a periodic signal. A periodic signal has a periodicity of 360° or 2π. Therefore, a periodic signal with the same phase angle is achieved by applying a specific desired phase shift to the signal or by applying this desired phase shift after a phase angle of an integer multiple of 2π is subtracted from or added to the desired phase shift. As long as the phase shifter covers at least a range of 2π, any desired phase shift can be achieved by a corresponding subtraction or addition. This corresponds basically to a modulo 2π operation. The control signal simply has to be changed accordingly, in order to be able to tune the phase shift applied by a phase shifter continuously over a large range.

It is a disadvantage of this approach, though, that the required control signal exhibits abrupt changes which are smoothened due to the inevitable finite bandwidth of any physical system. This problem will be illustrated in the following in more detail with reference to FIGS. 1 and 2.

FIG. 1 is a simplified block diagram of an exemplary system enabling the application of a phase shift to a periodic signal which is continuously tuned over a large range.

The system comprises a local oscillator 10 generating the periodic signal "LO" to which phase shifts are to be applied. The output of the oscillator 10 is connected to a phase shifter 11. The phase shifter 11 is able to apply phase shifts between −π and +π to an input periodic signal. The phase shifter 11 applies a respective phase shift as a linear function of a provided control voltage "PCon", a control voltage of 3V corresponding to a phase shift of +π and a control voltage of −3V corresponding to a phase shift of −π. The output of the phase shifter 11 constitutes the output of the system.

Further, the system comprises a control voltage generator 14 which outputs a control voltage "In". The control voltage generator 14 is connected via a processing unit 15 to a control input of the phase shifter 11. Between the processing unit 15 and the control input of the phase shifter 11, a lowpass filter 16 is indicated in addition. This lowpass filter 16 does not constitute a distinct component, but models the finite bandwidth of the system.

The operation of the system will now be described with reference to FIG. 2. FIG. 2 is a diagram depicting the waveform of three signals occurring in the system of FIG. 1.

The local oscillator 10 generates a periodic signal "LO" and provides it to the phase shifter 11.

At the same time, the control voltage generator 14 generates and provides a control voltage "In" representing the desired phase shift. In the current example, the control voltage "In" has the form of a decreasing ramp, indicating that the phase angle of the periodic signal is to be decreased continuously with a certain speed. The amplitude in Volt V of the decreasing ramp is depicted in FIG. 2 over a time span of 100 µs, the amplitude decreasing within this time span from 0V to −20V.

The control voltage "In" is converted by the processing unit 15 to an equivalent saw wave "OCon" by adding a voltage of 3V to the control voltage "In" and by further using a modulo 2π operation on the resulting increased voltage. That is, whenever the resulting increased voltage falls below −3V, additional 6V are added to it. The amplitude in Volt V of the saw wave "OCon", which is equally depicted in FIG. 2 over a time span 100 µs, thus decreases from 3V to −3V and then jumps back to 3V before decreasing again.

The generated saw wave "OCon" is provided by the processing unit 15 to the control input of the phase shifter 11. Due to the finite bandwidth of the system, however, the real control voltage "PCon" fed to the phase shifter 11 corresponds to this saw wave "OCon" after subjection to a lowpass filtering represented by lowpass filter 16. The amplitude in Volt V of the real control voltage "PCon" is equally depicted in FIG. 2 over a time span of 100 µs. The difference between the generated saw wave "OCon" and the real control voltage "PCon" represents the distortion due to the finite bandwidth of the system.

The phase shifter 11 applies to the received periodic signal "LO" a phase shift which corresponds to the received real control voltage "PCon". The distortion of the saw wave "OCon" thus appears also in the phase of the signal "Out" output by the phase shifter 11.

SUMMARY OF THE INVENTION

It is an object of the invention to improve the application of phased shifts which are continuously tuned over a wide range to a periodic signal. It is in particular an object to reduce distortions in the phase angle of a periodic signal to which such phase shifts are applied.

On the one hand, a system for applying a continuously tuned phase shift to a periodic signal is proposed, which periodic signal has a periodicity of 2π and is modulated arbitrarily. The arbitrary modulation is to be understood to include as well a possible absence of modulation. The proposed system comprises a first phase shifter shifting a phase of the periodic signal in accordance with a provided first control signal within a phase shifting range covering at least 2nπ, wherein n is a natural number greater than zero. The first control signal varies smoothly, i.e. with a limited band-width, within a control signal range which corresponds to a phase shifting range covering 4nπ and jumps between its maximum and its minimum value whenever a boarder of the control signal range is reached. The proposed system further comprises a second phase shifter shifting the phase of the periodic signal in accordance with a provided second control signal within a phase shifting range covering at least $2n\pi$. The second control signal is identical to the first control signal except that it is shifted in time compared to the first control signal such that maximum and minimum values of the second control signal occur in the middle between maximum and minimum values of the first control signal. Finally, the proposed system comprises a switching component. The switching component selects an output of the first phase shifter, whenever a provided third control signal indicates that the value of the first control signal is closer to the middle of the control signal range. The switching component selects an output of the second phase shifter, whenever the third control signal indicates that the value of the second control signal is closer to the middle of the control signal range.

On the other hand, a corresponding method of applying a continuously tuned phase shift to a periodic signal, which periodic signal has a periodicity of $2\pi$, is proposed.

The invention proceeds from the consideration that the distortion of the control signal occurs mainly during the abrupt changes of the control signal. It is therefore proposed that the output of a phase shifter is only used in between the abrupt changes of the control signal controlling the phase shifter. In order to enable a tuning of the phase shift over the entire range of $2n\pi$ nevertheless, the range of the supplied control voltage is increased. In order to enable a continuous tuning over time, in addition a second phase shifter is provided, which is controlled by the same control voltage as the first phase shifter, but shifted in time. A continuous tuning over the entire range of $2n\pi$ can then be achieved by selecting alternately the output of the first and the second phase shifter.

It is an advantage of the invention that the signal phase output by the switching component is close to ideal despite the distorted control signals.

Preferred embodiments of the invention become apparent from the dependent claims.

The control signals can be in particular either control voltages or control currents.

The phase shifting range can be in particular a range covering at least $2\pi$, while the control voltage can be in particular a range corresponding to a phase shifting range covering $4\pi$.

It is to be noted that the system according to the invention may be anything from a circuit comprising basically only the proposed arrangement of two phase shifters and a switch to any larger entity including the proposed arrangement of two phase shifters and a switch.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not drawn to scale and that they are merely intended to conceptually illustrate the structures and procedures described herein.

DETAILED DESCRIPTION OF THE INVENTION

Figure 1:
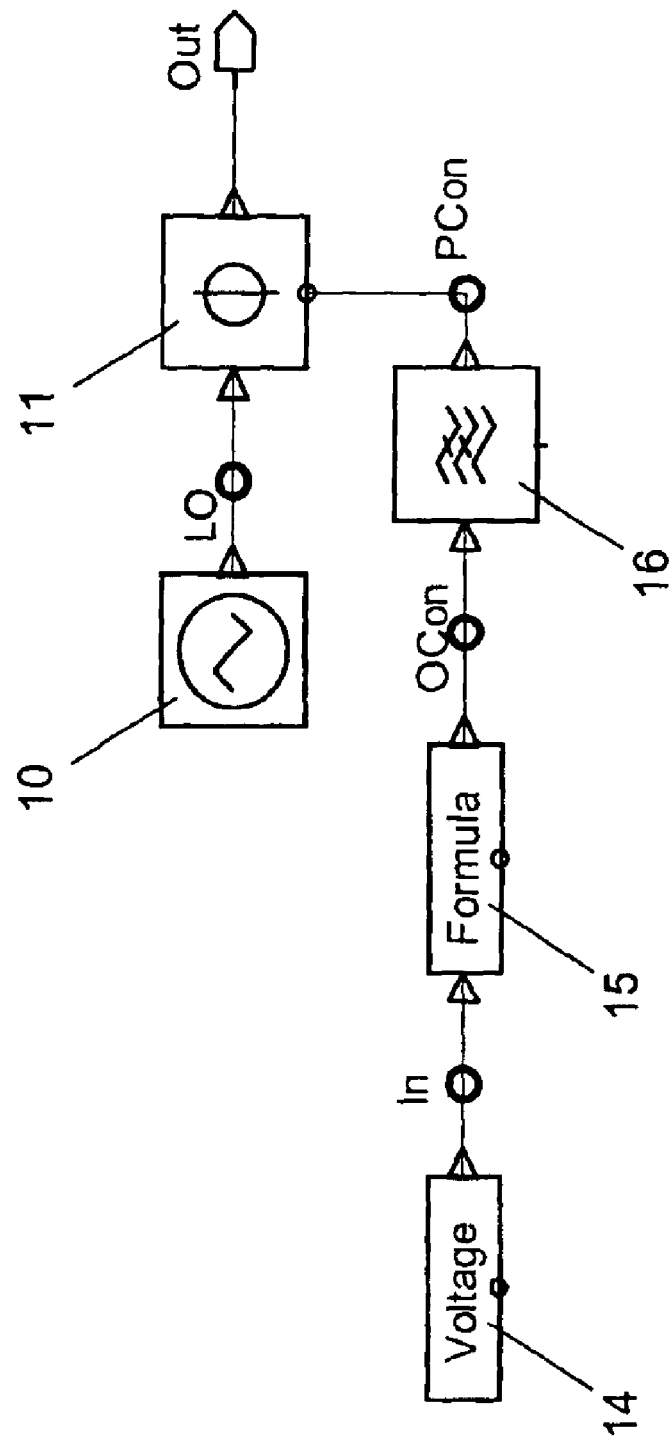
FIG. 1 is a schematic block diagram of a known system utilizing a phase shifter.
Figure 2:
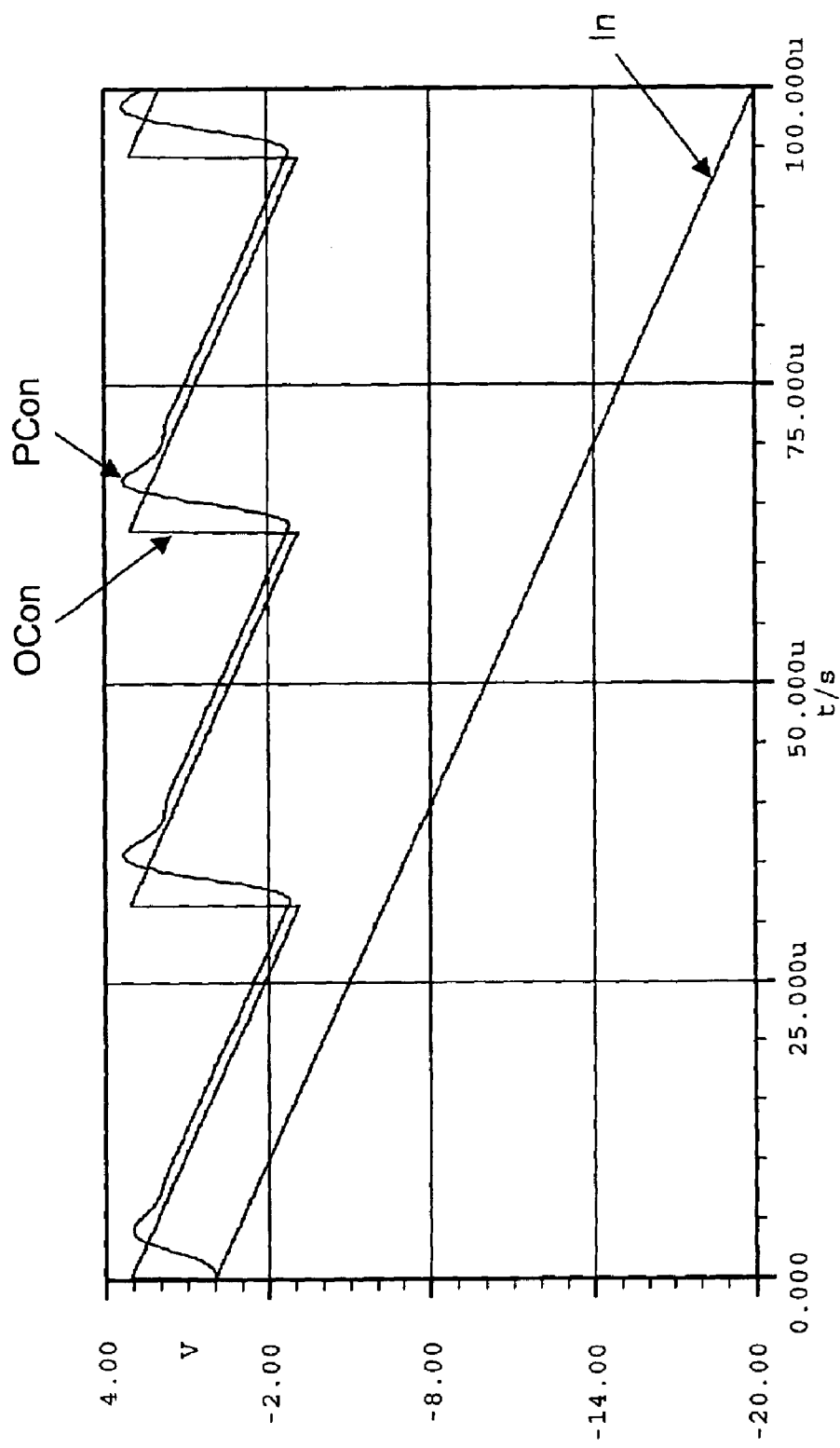
FIG. 2 is a diagram illustrating waveforms occurring in the system of FIG. 1.

FIGS. 1 and 2 were already described above.

An embodiment of the system according to the invention will now be described with reference to FIGS. 3 to 6.

Figure 3:
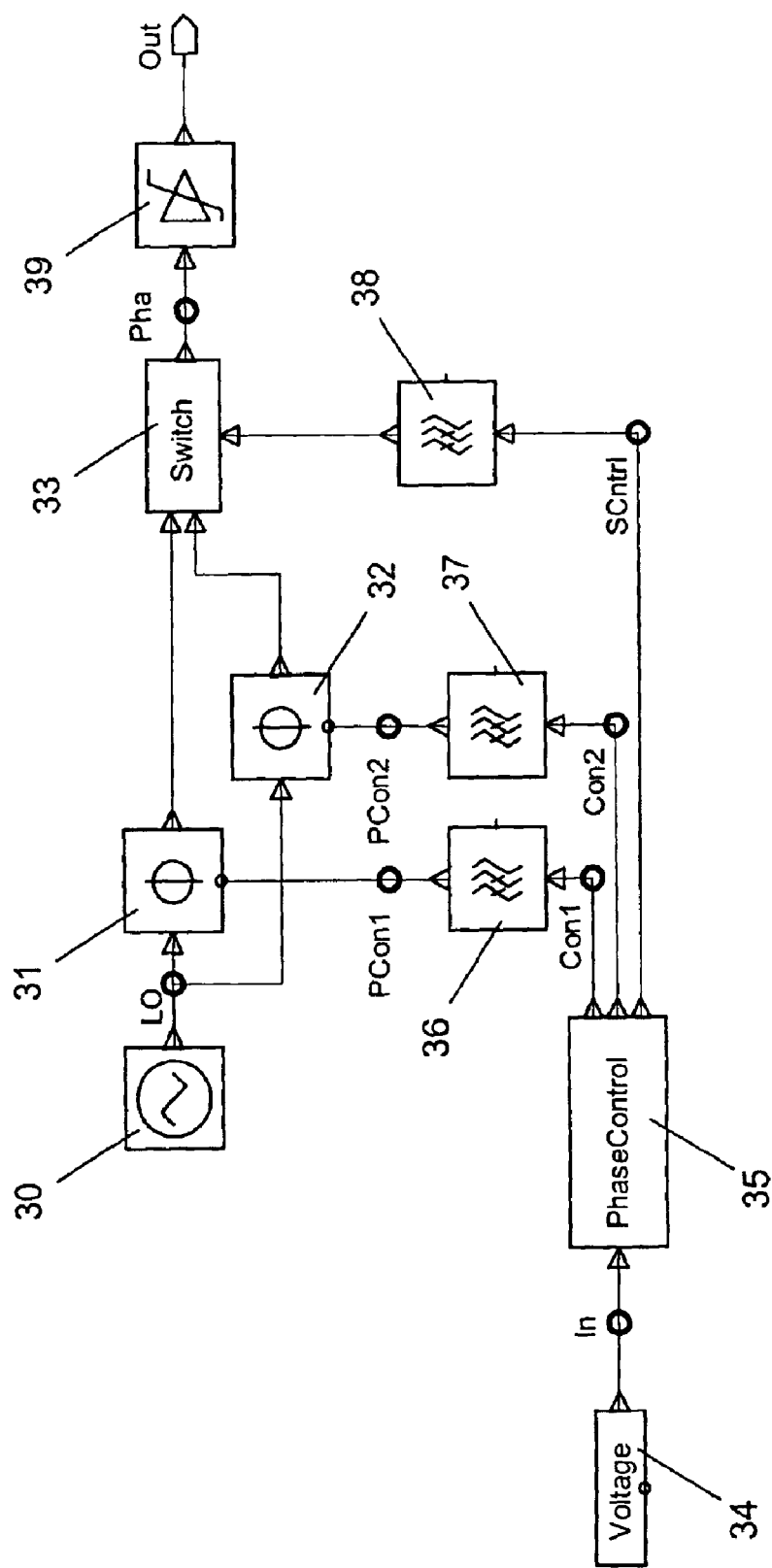
FIG. 3 is a schematic block diagram of a system utilizing a phase shifter according to the invention.

FIG. 3 is a simplified block diagram of an embodiment of the system according to the invention, which can be employed for applying a phase shift to a periodic signal which is continuously tuned over a large range.

The system of FIG. 3 comprises a local oscillator 30 generating a periodic signal "LO" to which phase shifts are to be applied. The output of the oscillator 30 is connected on the one hand to a first phase shifter 31 and on the other hand to a second phase shifter 32. Both phase shifters 31, 32 are able to apply to an input periodic signal a phase shift between $-\pi$ and $+\pi$.

Similarly as the phase shifter 11 of FIG. 1, the phase shifters 31, 32 of FIG. 3 apply a phase shift as a linear function of a provided control voltage "PCon1" and "Pcon2", respectively. A control voltage "PCon1", "Pcon2" of 3V corresponds for both phase shifters 31, 32 to a phase shift of $+\pi$, and a control voltage "PCon1", "Pcon2" of $-3V$ corresponds for both phase shifters 31, 32 to a phase shift of $-\pi$. The output of both phase shifters 31, 32 is connected to a dedicated input of a switch 33.

The system of FIG. 3 further comprises a control voltage generator 34. The output of the control voltage generator 34 is connected to a phase control unit 35. A first output of the phase control unit 35 is connected to a control input of the first phase shifter 31. A second output of the phase control unit 35 is connected to a control input of the second phase shifter 32. A third output of the phase control unit 35 is connected to a control input of the switch 33.

Between each of the outputs of the phase control unit 35 and the respective control input of the phase shifters 31, 32 and the switch 33, a respective lowpass filter 36, 37, 38 is indicated. Similarly as in FIG. 1, these lowpass filters 36, 37, 38 do not constitute distinct components, but model the finite bandwidth of the system for each of the control signals output by phase control unit 35.

Finally, a limiter 39 is connected to the output of the switch 33, the output of the limiter 39 constituting the output of the system of FIG. 3.

Figure 4:
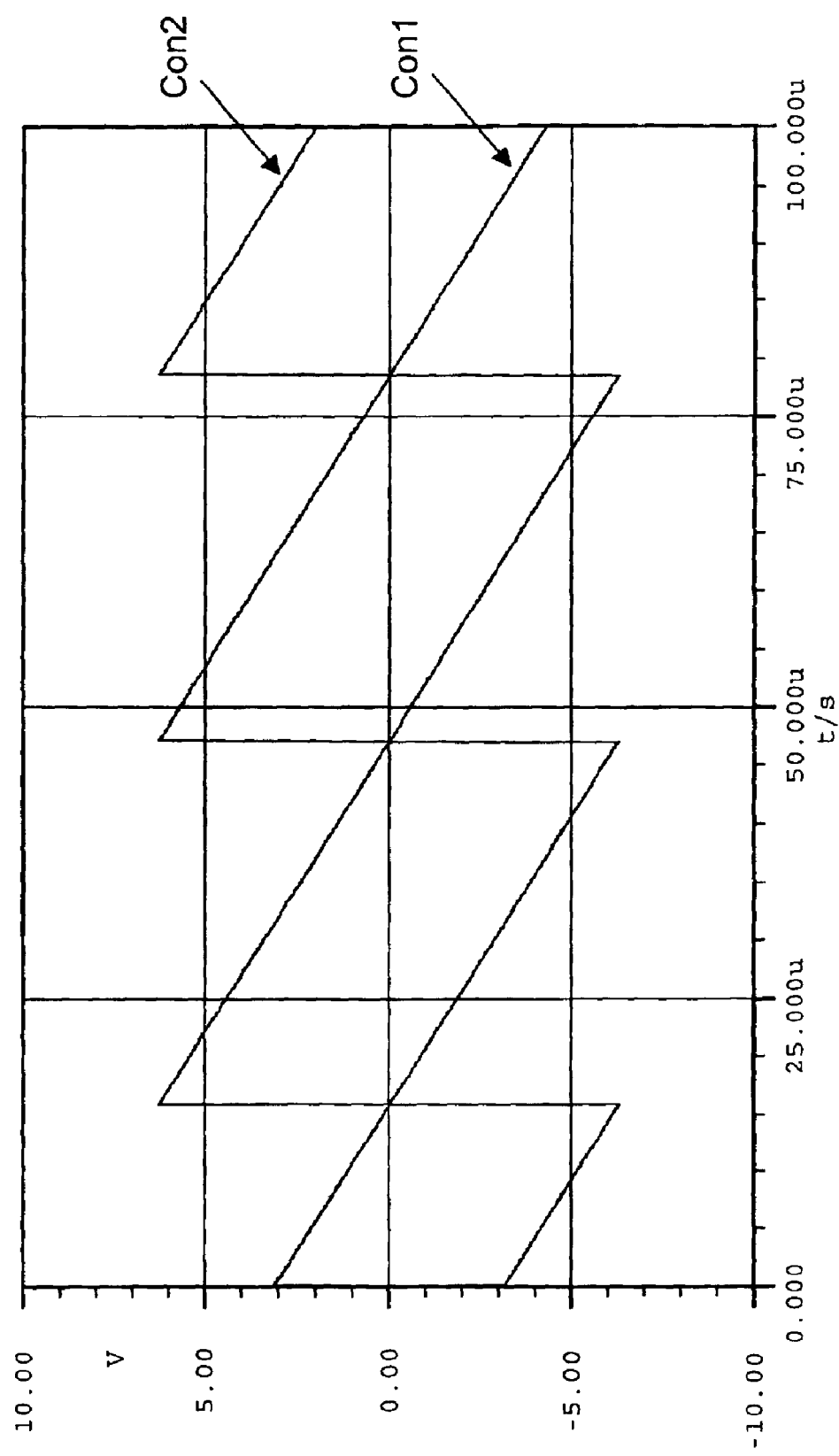
FIG. 4 is a diagram illustrating waveforms occurring in the system of FIG. 3.
Figure 5:
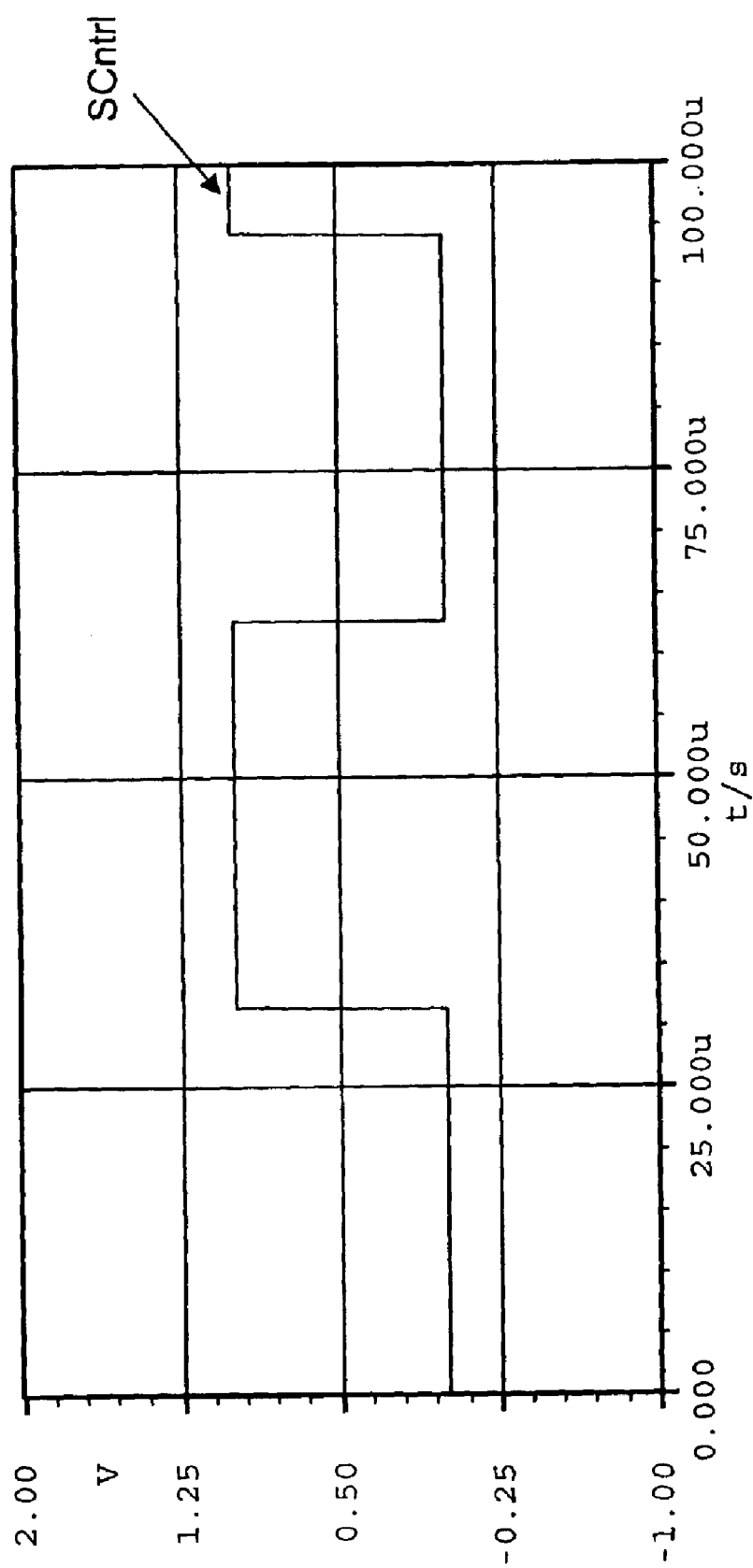
FIG. 5 is a diagram illustrating further waveforms occurring in the system of FIG. 3.
Figure 6:
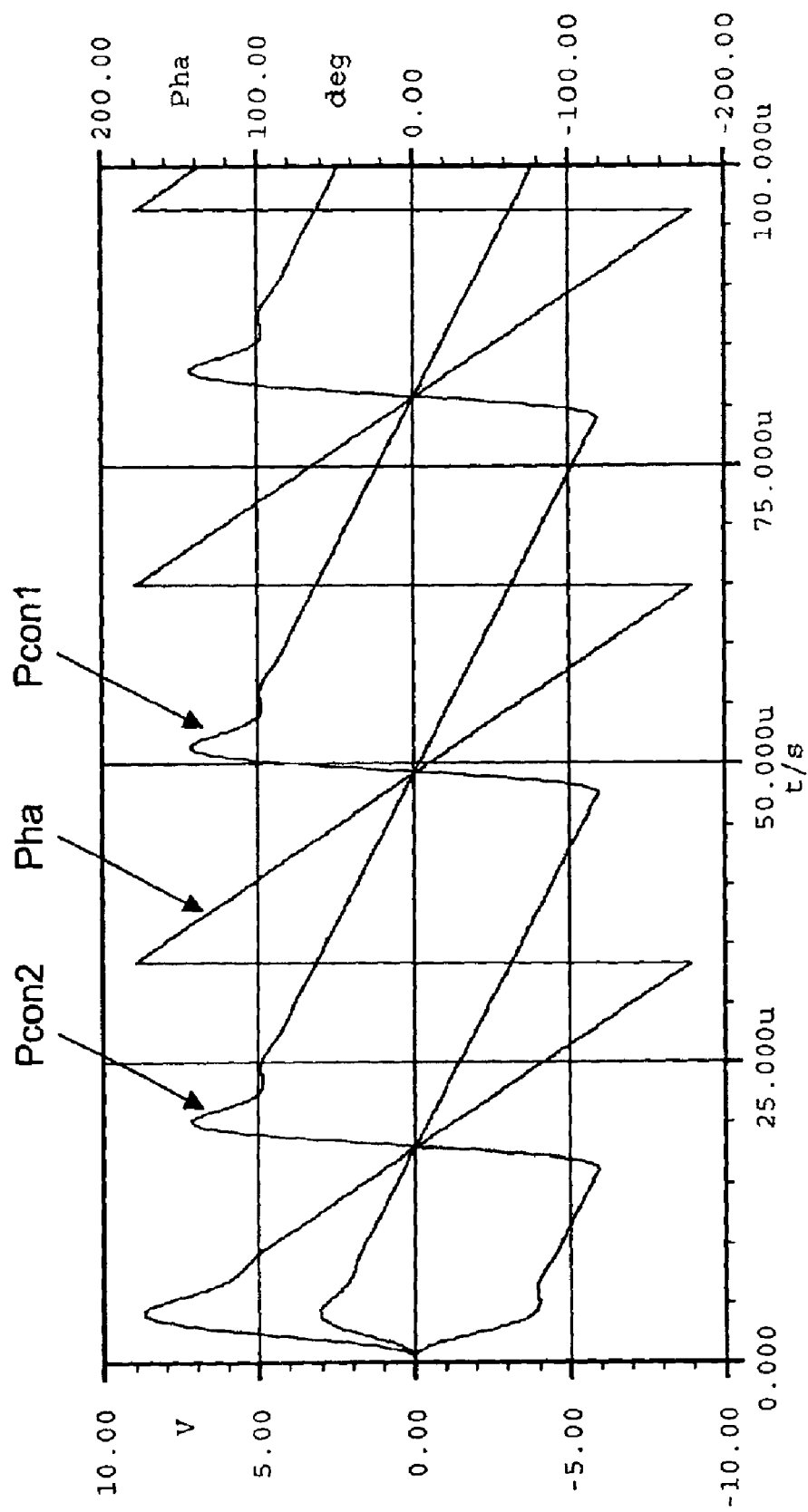
FIG. 6 is a diagram illustrating still further waveforms occurring in the system of FIG. 3.

The operation of the presented system will now be described with reference to FIGS. 4 to 6. FIGS. 4 to 6 are diagrams depicting the waveforms of six signals occurring in the system of FIG. 3.

The oscillator 30 generates a periodic signal "LO" to which continuously tuned phase shifts are to be applied and provides the signal to the first phase shifter 31 and to the second phase shifter 32.

At the same time, the control voltage generator 34 generates and provides a control voltage "In" representing the phase shifts which are to be applied to the provided periodic signal "LO". The control voltage "In" has again the form of a decreasing ramp, and it is identical to the control voltage "In" which is provided by the control voltage generator 14 of FIG. 1 and which is depicted in the diagram of FIG. 2. In the system of FIG. 3, however, the original control voltage will be divided between the two phase shifters 31, 32.

The control voltage "In" is fed to this end by the control voltage generator 34 to the phase control unit 35. The phase control unit 35 generates out of the received control voltage "In" three new control voltages "Con1", "Con2" and "SCntrl".

First, the phase control unit 35 converts the control voltage "In" to a saw wave. This is achieved by adding a voltage of 3V to the control voltage "In" and by adding additional 6V to the increased control voltage whenever it falls below −3V. The resulting saw wave thus decreases from 3V to −3V and then jumps back to 3V before decreasing again. The first processing step performed by the phase control unit 35 of the system of FIG. 3 thus corresponds exactly to the processing performed by the processing unit 15 of the system of FIG. 1, and the resulting saw wave corresponds to the saw wave "OCon" depicted in FIG. 2.

Next, the phase control unit 35 expands the obtained saw wave. More specifically, the amplitude of the saw wave is multiplied by a factor 2 and in addition, the saw wave is stretched to cover the double amount of time. The resulting waveform thus decreases from 6V to −6V and then jumps back to 6V before decreasing again, the repetition rate of this cycle of decreasing once from 6V to −6V being halved compared to the repetition rate of the cycle of decreasing once from 3V to −3V of the original saw wave. The new saw wave is then split up into two identical saw waves, which are shifted in time against each other by half a cycle. The amplitude in Volt V of the resulting pair of saw waves constituting control signals "Con1" and "Con2" is depicted in FIG. 4 over a time span of 100 μs. The first control signal "Con1" starts off with an amplitude of 3V, while the second control signal "Con2" starts off with an amplitude of −3V.

It is understood that the control signals "Con1", "Con2" can equally be obtained with any other suitable processing steps out of the original control signal "In".

Finally, the phase control unit 35 compares the two generated control signals "Con1" and "Con2". Based on this comparison, the phase control unit 35 generates a third control signal "SCntrl". This control signal "SCntrl" is a binary signal which has a low level, whenever the absolute value of the control signal "Con1" is smaller than the absolute value of the control signal "Con2" and thus closer to the zero voltage, and a high level, whenever the absolute value of the control signal "Con2" is smaller than the absolute value of the control signal "Con1" and thus closer to the zero voltage. The amplitude in Volt V of the resulting control signal "SCntrl" is depicted in FIG. 5 over a time span of 100 μs. Here, a low level corresponds to an amplitude of about 0V, while a high level corresponds to an amplitude of about 1V.

The control signal "Con1" is fed by the phase control unit 35 to the control input of the first phase shifter 31. The real control signal "PCon1" reaching the control input of the first phase shifter 31 is a distorted saw wave, due to the finite bandwidth of the system represented by lowpass filter 36. The second saw wave "Con2" is fed by the phase control unit 35 to the control input of the second phase shifter 32. The real control signal "PCon2" reaching the control input of the second phase shifter 32 is equally a distorted saw wave, due to the finite bandwidth of the system, which is represented in this case by lowpass filter 37. The amplitude in Volt V of both real control signals "PCon1", "PCon2" is depicted in FIG. 6 over a time span of 100 μs.

The control signal "SCntrl" is fed by the phase control unit 35 to the control input of the switch 33. Also control signal "SCntrl" is distorted when reaching the control input of the switch 33 due to the finite bandwidth of the system, the finite bandwidth being represented in this case by lowpass filter 38.

Each of the phase shifters 31, 32 applies phase shifts to the received periodic signal "LO", which correspond to the respective input control signal "PCon1", "PCon2". The range between 6V and −6V, which is covered by the control signals "PCon1", "PCon2", corresponds to a phase shift of +2π to −2π. The phase shifters 31, 32 only have to be able to apply phase shifts which correspond linearly to the respective control signal "PCon1", "PCon2" in a range between 3V and −3V, though.

The phase shifters 31, 32 provide the phase shifted signals to the switch 33. The switch 33 forwards the signal received from the first phase shifter 31, whenever the control signal "SCntrl" at its control input is low. Otherwise, the switch 33 forwards the signal received from the second phase shifter 32.

By selecting alternately one out of two shifted periodic signals, it is possible to avoid using signal parts that are based on a respective control voltage "PCon1", "PCon2" in the vicinity its major distortions.

The phase angle "Pha" in degrees of the phase shifted periodic signal output by the switch 33 is depicted in FIG. 6 over 100 μs, together with the distorted control signals "PCon1", "PCon2". As can be seen, the phase angle of the output signal, which is varying between +180° and −180°, is close to ideal in spite of the distorted control signals.

The limiter 39 connected between the output of the switch 33 and the output of the presented system of FIG. 3 is provided only in case the provided periodic signal "LO" has a constant envelope. In this case, a possible gain difference in the two phase shifters 31, 32 can be compensated by using this limiter 39.

It is to be noted that control voltage "In" was selected to have the form of a decreasing ramp only for the purpose of a particularly simple illustration. In real applications, usually more or less random, smoothly varying control signals are employed, which can equally be processed by the presented system.

While there have shown and described and pointed out fundamental novel features of the invention as applied to a preferred embodiment thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A system for applying a continuously tuned phase shift to a periodic signal, which periodic signal has a periodicity of 2 and is modulated arbitrarily, said system comprising:

a first phase shifter shifting a phase of said periodic signal in accordance with a provided first control signal within a phase shifting range covering at least 2n, wherein n is a natural number greater than zero, said first control signal varying smoothly within a control signal range which corresponds to a phase shifting range covering 4n and jumping between a maximum and a minimum value whenever a border of said control signal range is reached;

a second phase shifter shifting the phase of said periodic signal in accordance with a provided second control signal within said phase shifting range covering at least 2n, said second control signal being identical to said first control signal except that it is shifted in time compared to said first control signal such that maximum and minimum values of said second control signal occur in the middle between said maximum and said minimum values of said first control signal; and a switching component selecting an output of said first phase shifter whenever the value of said first control signal is closer to the middle of said control signal range and selecting an output of said second phase shifter whenever the value of said second control signal is closer to the middle of said control signal range.

2. The system of claim 1, further comprising a phase control unit, said phase control unit receiving an original control signal representing the continuous change of a phase shift which is to be applied to said periodic signal, and said phase control unit providing said first control signal, said second control signal and a third control signal which indicates which one of said first control signal and said second control signal is closer to the middle of said control signal range.

3. The system of claim 2, wherein said phase control unit
converts said received original control signal to a signal corresponding to phase shifts within a phase shifting range of 2n;

doubles the value of said converted signal to cover said control signal range corresponding to said phase shifting range of 4n and reduces the rate of change of said converted signal by two;

splits the resulting signal into two identical control signals and shifts said identical control signals in time against each other such that the maximum of a first control signal occurs at the same time as the mean value of a second control signal, and vice versa;

provides said first control signal to said first phase shifter and said second control signal to said second phase shifter; and generates said third control signal and provides said third control signal to said switching component.

4. The system according to claim 2, further comprising a control signal generator generating said original control signal.

5. The system according to claim 1, further comprising an oscillator generating said periodic signal and providing said periodic signal to said first phase shifter and to said second phase shifter.

6. The system according to claim 1, wherein said periodic signal has a constant envelope and wherein said system further comprises a limiter connected to an output of said switching component, said limiter compensating a possible gain difference in said first and said second phase shifter.

7. A method of applying a continuously tuned phase shift to a periodic signal, wherein said periodic signal has a periodicity of 2 and is modulated arbitrarily, said method comprising:

providing a first and a second control signal, said first and said second control signals varying smoothly within a control signal range which corresponds to a phase shifting range covering 4n, wherein n is a natural number greater than zero, and jumping between a maximum and a minimum value whenever a border of said control signal range is reached, said first and said second control signal being identical to each other but shifted against each other in time such that maximum and minimum values of said second control signal occur in the middle between said maximum and said minimum values of said first control signal;

shifting said periodic signal in phase in accordance with said provided first control signal over a range of at least 2n to obtain a first phase shifted periodic signal;

shifting said periodic signal in phase in accordance with said provided second control signal over a range of at least 2n to obtain a second phase shifted periodic signal; and selecting said first phase shifted periodic signal, whenever the value of said first control signal is closer to the middle of said control signal range and selecting said second phase shifted periodic signal, whenever the value of said second control signal is closer to the middle of said control signal range.

8. The method according to claim 7, further comprising:
converting an original control signal, which original control signal represents the continuous change of a phase shift which is to be applied to said periodic signal, to a signal corresponding to phase shifts within a phase shifting range of 2n;

doubling the value of said converted signal to cover said control signal range corresponding to said phase shifting range of 4n and reducing the rate of change of said converted signal by two;

splitting the resulting signal into two identical control signals and shifting said identical control signals in time against each other such that the maximum of a first control signal occurs at the same time as the mean value of a second control signal, and vice versa; and generating a third control signal which indicates which one of said first and said second control signals is currently closer to the middle of said control signal range, and using said third control signal for selecting a phase shifted periodic signal out of said first phase shifted periodic signal and said second phase shifted periodic signal.

9. The method according to claim 7, wherein said periodic signal has a constant envelope, said method further comprising compensating a possible gain difference when shifting said periodic signal in phase in accordance with said provided first control signal and when shifting said periodic signal in phase in accordance with said provided second control signal.

* * * * *

UNITED STATES PATENT AND TRADEMARK OFFICE
CERTIFICATE OF CORRECTION

PATENT NO. : 6,870,414 B2
DATED : March 22, 2005
INVENTOR(S) : Rosnell

It is certified that error appears in the above-identified patent and that said Letters Patent is hereby corrected as shown below:

Title page,
Item [57], ABSTRACT,
Line 10, delete the word "boarder" and insert -- border -- therefor.

Column 2,
Line 65, please delete the word "boarder" and insert -- border -- therefor.

Signed and Sealed this

Ninth Day of August, 2005

JON W. DUDAS
*Director of the United States Patent and Trademark Office*